United States Patent
Ho et al.

(10) Patent No.: US 6,350,689 B1
(45) Date of Patent: Feb. 26, 2002

(54) METHOD TO REMOVE COPPER CONTAMINATION BY USING DOWNSTREAM OXYGEN AND CHELATING AGENT PLASMA

(75) Inventors: Paul Ho; Simon Chooi; Yakub Aliyu; Mei Sheng Zhou; John Sudijono; Subhash Gupta; Sudipto Ranendra Roy; Yi Xu, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/839,962

(22) Filed: Apr. 23, 2001

(51) Int. Cl.[7] ............................................. H01L 21/44
(52) U.S. Cl. .................. 438/687; 438/707; 438/710; 438/906
(58) Field of Search ................ 438/687, 906, 438/707, 710

(56) References Cited

U.S. PATENT DOCUMENTS

| | | | |
|---|---|---|---|
| 5,328,555 A | 7/1994 | Gupta | 156/643 |
| 5,567,244 A | 10/1996 | Lee et al. | 134/3 |
| 5,851,303 A | 12/1998 | Hwang et al. | 134/3 |
| 5,914,278 A | 6/1999 | Boitnott et al. | 438/724 |
| 5,930,586 A | 7/1999 | Jain et al. | 438/14 |
| 5,967,156 A | 10/1999 | Rose et al. | 134/7 |
| 6,136,708 A | * 10/2000 | Aoki | 438/687 |
| 6,159,859 A | * 12/2000 | Robertson, III et al. | 438/706 |
| 6,228,563 B1 | * 5/2001 | Starov et al. | 430/327 |

* cited by examiner

Primary Examiner—John F. Niebling
Assistant Examiner—Lynne Gurley
(74) Attorney, Agent, or Firm—George O. Saile; Rosemary L. S. Pike; Stephen G. Stanton

(57) ABSTRACT

A method of removing copper contamination from a semiconductor wafer, comprising the following steps. A semiconductor wafer having copper contamination thereon is provided. An oxidizing radical containing downstream plasma is provided from a first source (alternatively halogen ($F_2$, $Cl_2$, or $Br_2$) may be used as on oxidizing agent). A vaporized chelating agent is provided from a second source. The oxidizing radical containing downstream plasma and vaporized chelating agent are mixed to form an oxidizing radical containing downstream plasma/vaporized chelating agent mixture. The mixture is directed to the copper contamination so that the mixture reacts with the copper contamination to form a volatile product. The volatile product is removed from the proximity of the wafer.

40 Claims, 2 Drawing Sheets

US 6,350,689 B1

METHOD TO REMOVE COPPER CONTAMINATION BY USING DOWNSTREAM OXYGEN AND CHELATING AGENT PLASMA

FIELD OF THE INVENTION

The present invention relates generally to fabrication of semiconductor devices used in integrated circuits, and specifically to a method of removing copper contamination during fabrication of semiconductor devices.

BACKGROUND OF THE INVENTION

One of the problems in integrating copper (Cu) into the wafer fabrication process is the threat of Cu contamination. As Cu diffuses very fast within silicon dioxide ($SiO_2$) based dielectric layers and Si substrates, removal of Cu contamination becomes very important.

U.S. Pat. No. 5,967,156 to Rose et al. describes a method of processing foreign material on the surface of a substrate. In one aspect, a directed flow of reactant fluid is provided to the vicinity of the foreign material. An aerosol of at least partially frozen particles is continuously or intermittently delivered to the foreign material to aid the reactant in reacting with the foreign material to form the reaction product. In another aspect, a directed flow of reactant fluid is provided to the foreign material in a limited area reaction region and the foreign material is agitated to aid the reactant in reacting with the foreign material to form the reaction product. Infrared or ultraviolet radiation may also be delivered to the foreign material.

U.S. Pat. No. 5,914,278 to Boitnott et al. describes a modular semiconductor wafer processing system comprising a chamber with a wafer support and gas manifold structure that supplies reactive gases through a showerhead delivery system to one side of a wafer, and exhausts both the reactive gasses and a non-reactive gas flow. The other side of the wafer is protected from the reactive gasses by evenly delivering the non-reactive gasses from a platen close to the wafer.

U.S. Pat. No. 5,851,303 to Hwang et al. describes a method for removing metal surface contaminants from a silicon metalloid. The silicon is sequentially contacted with gaseous hydrogen fluoride and then with an aqueous solution comprising at least one-half-weight percent hydrogen peroxide. The method is useful for recovering copper from the surface of semiconductor grade silicon in an aqueous solution which can be analyzed directly to determine the amount of copper contamination of the surface of the silicon.

U.S. Pat. No. 5,567,244 to Lee et al. describes a process for cleaning semiconductor devices contaminated by copper. Oxygen is used to form a cupric oxide, which forms a cupric fluoride, which is then removed from the solution.

U.S. Pat. No. 5,328,555 to Gupta describes a method of removing particles from the surface of a substrate. A plasma is formed from an inert plasma precursor gas in a vacuum chamber which lifts loosely adhered particles from the surface of the substrate. The flow of the inert gas is increased without increasing the pressure in the vacuum chamber, thereby sweeping the particles beyond the surface of the substrate where they can be removed by the vacuum chamber exhaust system.

U.S. Pat. No. 5,930,586 to Jain et al. describes a method and apparatus for detecting copper contamination on the backside of a wafer. A rotating wafer is raster scanned with an X-ray beam across the wafer's surface. Pluralities of arrayed X-ray detectors detect X-ray fluorescence emission from the surface of the wafer whereby copper contamination of the wafer can be determined.

SUMMARY OF THE INVENTION

Accordingly, it is an object of the present invention to remove copper contamination from a wafer by dry cleaning.

Another object of the present invention is to remove copper contamination from the backside of a wafer by dry cleaning to reduce the risk of cross-contamination.

A further object of the present invention is to remove copper contamination by dry cleaning during copper rework.

Other objects will appear hereinafter.

It has now been discovered that the above and other objects of the present invention may be accomplished in the following manner. Specifically, a semiconductor wafer having copper contamination thereon is provided. An oxidizing radical containing downstream plasma is provided from a first source (alternatively halogen ($F_2$, $Cl_2$, or $Br_2$) may be used as on oxidizing agent). A vaporized chelating agent is provided from a second source. The oxidizing radical containing downstream plasma and vaporized chelating agent are mixed to form an oxidizing radical containing downstream plasma/vaporized chelating agent mixture. The mixture is directed to the copper contamination so that the mixture reacts with the copper contamination to form a volatile product. The volatile product is removed from the proximity of the wafer.

BRIEF DESCRIPTION OF THE DRAWINGS

The features and advantages of the method of the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Unless otherwise specified, all structures, layers, etc. may be formed or accomplished by conventional methods known in the prior art.

Figure 1:
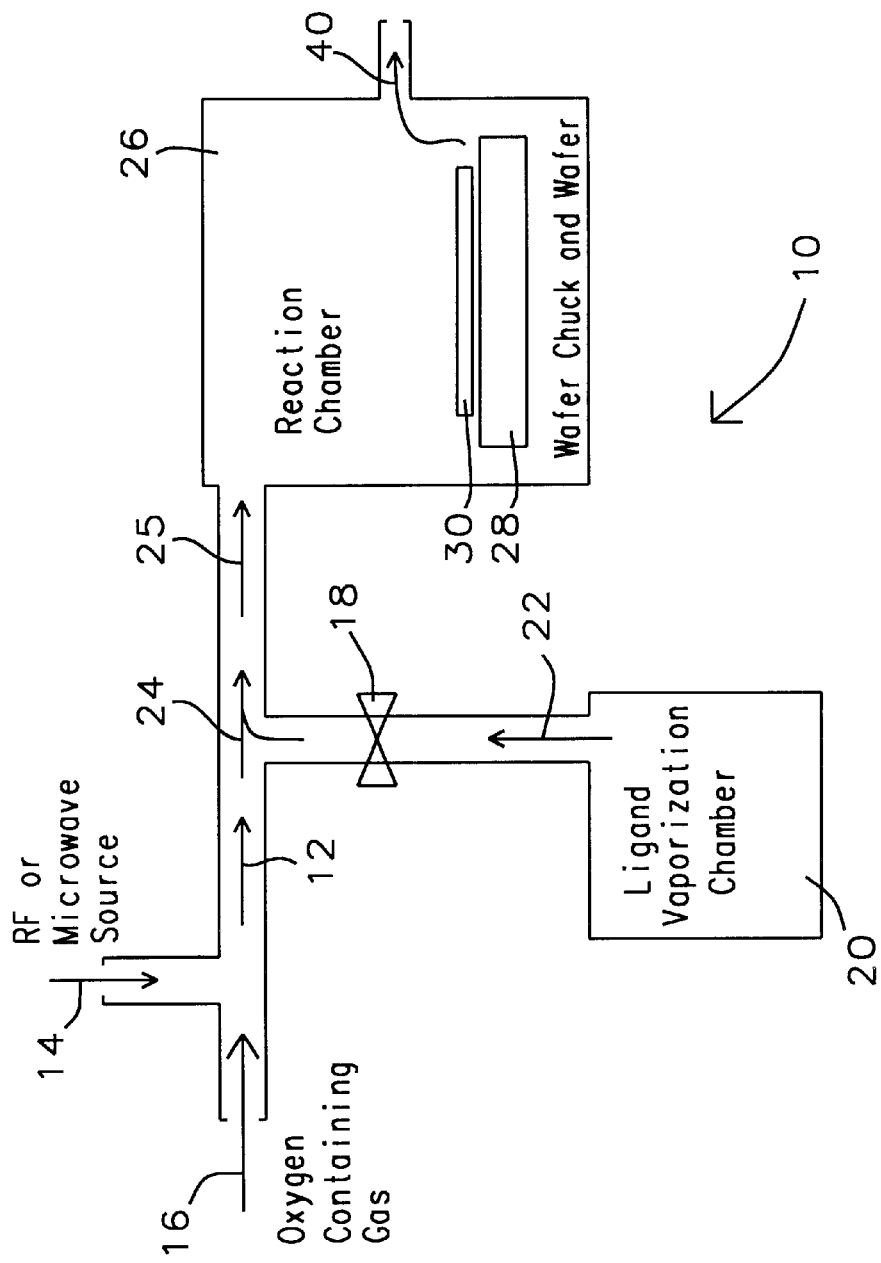
FIG. 1 schematically illustrates, in block diagram, the system of the present invention.

Accordingly, FIG. 1 shows a schematic block diagram the system 10 of the present invention.

Formation of Oxidizing Radical Containing Downstream Plasma

An oxidizing radical containing downstream plasma 12 is created by either a RF or microwave source 14 at a power from about 50 to 1000 watts and more preferably from about 100 to 500 watts. The RF source usually operates at 13.56 MHz. The microwave source usually operates at 2.45 GHz. The chamber operation pressure is preferably from about 0.01 Torr to 100 Torr, and more preferably from about 0.1 Torr to 10 Torr.

Oxidizing Radical

The source 16 of oxidizing radical can be, but is not limited to, oxygen ($O_2$) and ozone ($O_3$) gas. Another oxidizing radical sources 16 may be, for example, nitrous oxide ($N_2O$). Alternatively, a halogen such as $F_2$, $Cl_2$, or $Br_2$, may be used as an oxidizing agent.

The flow rate of the oxidizing radical source 16 is from about 10 to 1000 sccm, and more preferably from about 50 to 500 sccm. The temperature of the oxidizing radical source 16 is from about 15 to 100° C., and more preferably from about 30 to 60° C.

Chelating Agent or Ligand

A chelating agent, or ligand, is provided at 22 by its own vapor pressure from ligand (or chelating agent) vaporization chamber 20. The chelating or ligand includes, but is not limited to, a β-diketone, most commonly hexafluoroacetylacetone (H(hfacac)).

The criteria for selecting a chelating agent or ligand requires that the resulting reaction with copper creates a product that is volatile, such as Cu(hfacac)$_2$ when H(hfacac) is the ligand. For example, the chelating or ligand may also be, for example, acetylacetone, trifluoroaceytelacetone, 6,6,7,7,8,8,8-heptafluoro -2,2-dimethyl-3,5-octanedione, or 2,2,6,6,-tetramethyl-3,5-heptanedione.

Ligand Vaporization Chamber 20

The ligand is introduced at 22 by its own vapor pressure from the ligand vaporization chamber 20 at a flow rate of from about 0.1 to 50 sccm, and more preferably from about 1 to 10 sccm. A precision metering valve 18 is used for the accurate control of the feed rate of the ligand. The temperature of the ligand vaporization chamber 20 and the feedline is preferably maintained at from about 50 to 100° C., and more preferably from about 60 to 85° C.

Formation of Vaporized Ligand/Oxidizing Radical Containing Downstream Plasma Mixture 25

The vaporized ligand 22 is mixed with the oxidizing radical containing downstream plasma 12 proximate 24.

Mixture 25 Enters Reaction Chamber 26

The vaporized ligand/oxidizing radical containing downstream plasma mixture 25 enters reaction chamber 26.

Wafer 30 is held by wafer chuck 28 within reaction chamber 26.

Reaction chamber 26 is preferably operated at a pressure of from about 0.01 Torr to 100 Torr, and more preferably from about 0.1 Torr to 10 Torr. Wafer 30 is preferably heated to a temperature from about 50 to 300° C., and more preferably from about 150 to 250° C. Inert gas, for example, Ar or He, flows at the back or front side of wafer 30 as necessary to stop any undesirable reaction.

Wafer Copper Contaminant Process Where Copper Backside Clean is Performed

Figure 2:
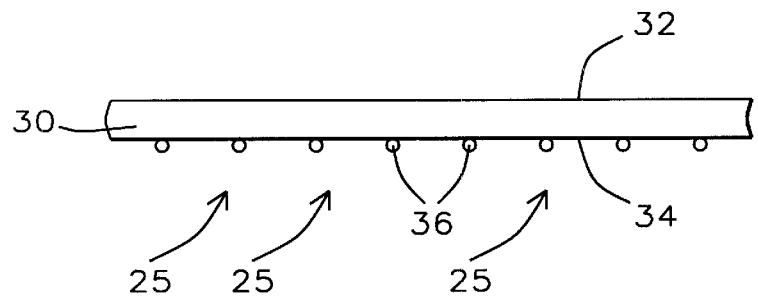
FIGS. 2–4 schematically illustrate in cross-sectional representation a preferred embodiment of the present invention.
Figure 3:
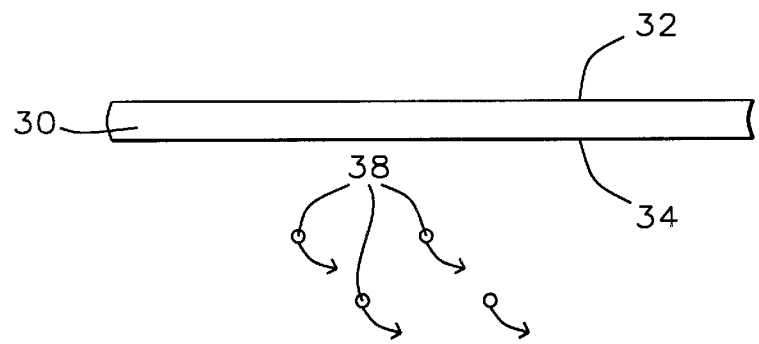

As shown in FIG. 2, wafer 30 may be comprised of silicon and has a front side 32 and a backside 34. Front side 32 of wafer 30 is the side of wafer 30 upon which semiconductor devices will be formed, e.g. source, drain, PETs, etc. Copper contamination 36 usually resides on backside 34 of wafer 30. Wafer 30 is placed on wafer chuck 28 backside 34 up.

Front side 32 of wafer 30 is protected by: an edge seal (not shown) that is similar to those used in Cu ECP and chemical mechanical polishing (CMP), for example; or by an inert gas flow such as He. The coating on back side 34 of wafer 30 may be SiO$_2$ or SiN, and is preferably SiN.

This copper contaminant clean step according to the present invention is performed:

1) before copper anneal;
2) before processing in a tool which also processes other non-Cu wafers, e.g. metrology tool, dielectric deposition tool, etc.; and
3) after Cu ECP and Cu CMP to reduce the possible high contamination at the backside.

Formation of Volatile Product 38

Ligand/oxidizing radical containing downstream plasma mixture 25 is directed to semiconductor structure/wafer 30 and reacts with copper contaminant 36 to create a volatile product 38, e.g.:

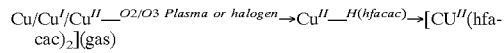

The resulting volatile product 38 (gaseous [Cu$^{II}$(hfacac)$_2$] in this example) includes copper contaminant 36 and separates from backside 34 of wafer 30 and mixes with the atmosphere within reaction chamber 26 and exits reaction chamber 26 in the exhaust from reaction chamber 26 at 40.

Specifically, the O$_2$/O$_3$ plasma (or halogen) portion of mixture 25 reacts with copper contaminant 36, whether Cu, Cu$^I$, or Cu$^{II}$, to convert it Cu and Cu$^I$ to Cu$^{II}$. Then the chelating agent/ligand portion of mixture 25 reacts with Cu$^{II}$ to form a volatile resulting product 38. The volatile resulting product 38 separates from the surface of wafer 30 so it may exit from reaction chamber 26 with the reaction chamber 26 exhaust at 40.

Figure 4:
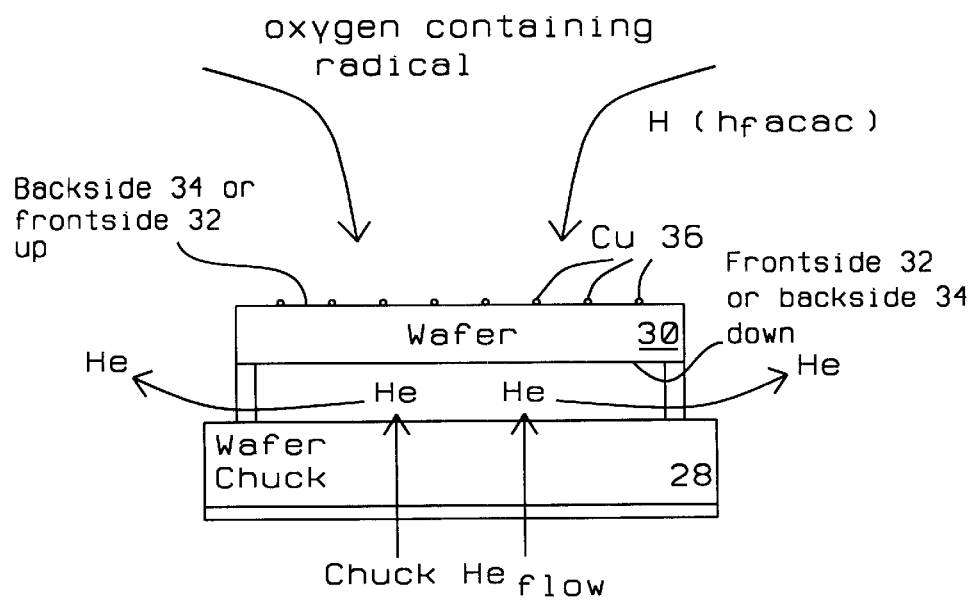

FIG. 4 illustrates details of processing wafer 30 on chuck 28.

It is noted that the method of the present invention may be used to clean either the back side 34 or the front side 32 of wafer 30. Depending upon the front side 32 of wafer 30, dry cleaning in accordance with the present invention may be applied on either or both sides 32, 34 of the wafer 30. If Cu metal lines are exposed, dry cleaning should apply only on the back side 34 of wafer 30. If Cu metal lines are protected by a dielectric but there are concerns of cross-contamination in subsequent processing steps, then the dry cleaning method of the present invention may apply to both sides 32, 34 of the wafer 30.

Copper Rework

The process of the present invention is also admirably suited for copper rework. Copper rework is required when a wafer has been subjected to a copper deposition step that forms copper structures not within acceptable tolerances. In many instances, it is possible to remove the copper structures by wet etching or dry etching, and rework the wafer to redeposit copper. However, selectivity of wet-etching may not be so good and dry etching using a halogen requires a high processing temperature. In any event, such a reworked wafer must have the copper contamination removed from both the front side and back side of the reworked wafer.

While particular embodiments of the present invention have been illustrated and described, it is not intended to limit the invention, except as defined by the following claims.

We claim:

1. A method of removing copper contamination from a semiconductor wafer, comprising the steps of:
   providing a semiconductor wafer having copper contamination thereon;
   providing from a first source an oxidizing radical containing downstream plasma;
   providing from a second source a vaporized chelating agent;
   mixing said oxidizing radical containing downstream plasma and said vaporized chelating agent to form an oxidizing radical containing downstream plasma/vaporized chelating agent mixture;
   directing said mixture to said copper contamination so that said mixture reacts with said copper contamination to form a volatile product; and
   removing said volatile product from proximity of said wafer.

2. The method of claim 1, wherein said oxidizing radical containing downstream plasma is formed from an oxygen containing gas exposed to an RF or microwave source; said oxygen containing gas being selected from the group comprising oxygen, ozone, and N$_2$O, having a flow rate of from about 50 to 500 sccm and at a temperature from about 15 to 100° C.

3. The method of claim 1, wherein said oxidizing radical containing downstream plasma is formed from an oxygen containing gas exposed to an RF or microwave source at a power of from about 100 to 500 watts.

4. The method of claim 1, wherein said vaporized chelating agent is selected from the group comprising hexafluoroacetylacetone, acetylacetone, trifluoroaceytelacetone, 6,6,7,7,8,8,8-heptafluoro-2,2-dimethyl-3,5-octanedione, and 2,2,6,6,-tetramethyl-3,5-heptanedione.

5. The method of claim 1, wherein said vaporized chelating agent is comprised of hexafluoroacetylacetone (H(hfacac)) and has a flow rate of from about 1 to 10 sccm.

6. The method of claim 1, wherein said vaporized chelating agent is comprised of a β-diketone and has a flow rate of from about 0.1 to 50 sccm.

7. The method of claim 1, wherein said vaporized chelating agent is formed from a chelating agent vaporized in a vaporization chamber.

8. The method of claim 1, wherein said copper contamination comprises Cu, $Cu^I$, and $Cu^{II}$;

said oxidizing radical containing downstream plasma reacts with said Cu and $Cu^I$ copper contamination to form $Cu^{II}$; and said vaporized chelating agent is hexafluoroacetylacetone (H(hfacac)) and reacts with said $Cu^{II}$ to form said volatile product;

wherein said volatile product is $[Cu^{II}(hfacac)_2]$ (gas).

9. The method of claim 1, wherein said semiconductor wafer is a copper rework.

10. The method of claim 1, wherein said semiconductor wafer has a front side, and a backside having said copper contamination; said semiconductor wafer being oriented backside up on a wafer chuck.

11. The method of claim 1, wherein said semiconductor wafer has a front side having said copper contamination, and a backside; said semiconductor wafer being oriented backside up on a wafer chuck; and said oxidizing radical containing downstream plasma having a flow rate of from about 50 to 500 sccm and at a temperature from about 15 to 100 C.

12. The method of claim 1, wherein said semiconductor wafer has a front side having said copper contamination, and a backside having said copper contamination; said semiconductor wafer being oriented backside up on a wafer chuck; and said oxidizing radical containing downstream plasma having a flow rate of from about 50 to 500 sccm and at a temperature from about 15 to 100 C.

13. The method of claim 1, wherein said semiconductor wafer is placed within a reaction chamber having a pressure from about 0.01 to 100 Torr, said semiconductor wafer having a temperature from about 50 to 300° C.

14. A method of removing copper contamination from a semiconductor wafer, comprising the steps of:

providing a semiconductor wafer having copper contamination thereon;

providing from a first source an oxidizing radical containing downstream plasma; said oxidizing radical containing downstream plasma being formed from an oxygen containing gas exposed to an RF or microwave source; said oxygen containing gas being selected from the group comprising oxygen, ozone, and $N_2O$, having a flow rate of from about 50 to 500 sccm and at a temperature from about 15 to 100 C.;

providing from a second source a vaporized chelating agent;

mixing said oxidizing radical containing downstream plasma and said vaporized chelating agent to form an oxidizing radical containing downstream plasma/vaporized chelating agent mixture;

directing said mixture to said copper contamination so that said mixture reacts with said copper contamination to form a volatile product; and removing said volatile product from proximity of said wafer.

15. The method of claim 14, wherein said RF or microwave source has a power of from about 100 to 500 watts.

16. The method of claim 14, wherein said vaporized chelating agent is selected from the group comprising hexafluoroacetylacetone, acetylacetone, trifluoroaceytelacetone, 6,6,7,7,8,8,8-heptafluoro-2,2-dimethyl-3,5-octanedione, and 2,2,6,6,-tetramethyl-3,5-heptanedione.

17. The method of claim 14, wherein said vaporized chelating agent is comprised of hexafluoroacetylacetone (H(hfacac)) and has a flow rate of from about 1 to 10 sccm.

18. The method of claim 14, wherein said vaporized chelating agent is comprised of a β-diketone and has a flow rate of from about 0.1 to 50 sccm.

19. The method of claim 14, wherein said vaporized chelating agent is formed from a chelating agent vaporized in a vaporization chamber.

20. The method of claim 14, wherein said copper contamination comprises Cu, $Cu^I$, and $Cu^{II}$, said oxidizing radical containing downstream plasma reacts with said Cu and $Cu^I$ copper contamination to form $Cu^{II}$; and said vaporized chelating agent is hexafluoroacetylacetone (H(hfacac)) and reacts with said $Cu^{II}$ to form said volatile product;

wherein said volatile product is $[Cu^{II}(hfacac)_2]$ (gas).

21. The method of claim 14, wherein said semiconductor wafer is a copper rework.

22. The method of claim 14, wherein said semiconductor wafer has a front side, and a backside having said copper contamination; said semiconductor wafer being oriented backside up on a wafer chuck.

23. The method of claim 14, wherein said semiconductor wafer has a front side having said copper contamination, and a backside; said semiconductor wafer being oriented backside up on a wafer chuck; and said oxidizing radical containing downstream plasma having a flow rate of from about 50 to 500 sccm and at a temperature from about 15 to 100 C.

24. The method of claim 14, wherein said semiconductor wafer has a front side having said copper contamination, and a backside having said copper contamination; said semiconductor wafer being oriented backside up on a wafer chuck; and said oxidizing radical containing downstream plasma having a flow rate of from about 50 to 500 sccm and at a temperature from about 15 to 100 C.

25. The method of claim 14, wherein said semiconductor wafer is placed within a reaction chamber having a pressure from about 0.01 to 100 Torr, said semiconductor wafer having a temperature from about 50 to 300° C.

26. A method of removing copper contamination from a semiconductor wafer, comprising the steps of:

providing a semiconductor wafer having copper contamination thereon;

providing from a first source an oxidizing radical containing downstream plasma; said oxidizing radical containing downstream plasma being formed from an oxygen containing gas exposed to an RF or microwave source; said oxygen containing gas being selected from the group comprising oxygen, ozone, and $N_2O$;

providing from a second source vaporized hexafluoroacetylacetone;

mixing said oxidizing radical containing downstream plasma and said vaporized hexafluoroacetylacetone to form an oxidizing radical containing downstream plasma/vaporized hexafluoroacetylacetone mixture;

directing said mixture to said copper contamination so that said mixture reacts with said copper contamination to form a volatile product; and removing said volatile product from proximity of said wafer.

27. The method of claim 26, wherein said semiconductor wafer is placed within a reaction chamber having a pressure from about 0.01 to 100 Torr, said semiconductor wafer having a temperature from about 50 to 300° C.

28. The method of claim 26, wherein said oxidizing radical containing downstream plasma has a flow rate of from about 50 to 500 sccm and at a temperature from about 15 to 100 C.

29. A method of removing copper contamination from a semiconductor wafer, comprising the steps of:

providing a semiconductor wafer having copper contamination thereon;

providing from a first source a halogen oxidizing agent;

providing from a second source a vaporized chelating agent;

mixing said halogen oxidizing agent and said vaporized chelating agent to form an oxidizing radical containing downstream plasma/vaporized chelating agent mixture;

directing said mixture to said copper contamination so that said mixture reacts with said copper contamination to form a volatile product; and removing said volatile product from proximity of said wafer.

30. The method of claim 29, wherein said vaporized chelating agent is selected from the group comprising hexafluoroacetylacetone, acetylacetone, trifluoroaceytelacetone, 6,6,7,7,8,8,8-heptafluoro-2,2-dimethyl-3,5-octanedione, and 2,2,6,6,-tetramethyl-3,5-heptanedione.

31. The method of claim 29, wherein said vaporized chelating agent is comprised of hexafluoroacetylacetone (H(hfacac)) and has a flow rate of from about 1 to 10 sccm.

32. The method of claim 29, wherein said vaporized chelating agent is comprised of a β-diketone and has a flow rate of from about 0.1 to 50 sccm.

33. The method of claim 29, wherein said vaporized chelating agent is formed from a chelating agent vaporized in a vaporization chamber.

34. The method of claim 29, wherein said copper contamination comprises Cu, $Cu^I$, and $Cu^{II}$;

said oxidizing radical containing downstream plasma reacts with said Cu and $Cu^I$ copper contamination to form $Cu^{II}$; and said vaporized chelating agent is hexafluoroacetylacetone (H(hfacac)) and reacts with said $Cu^{II}$ to form said volatile product; wherein said volatile product is $[Cu^{II}(hfacac)_2]$ (gas).

35. The method of claim 29, wherein said semiconductor wafer is a copper rework.

36. The method of claim 29, wherein said semiconductor wafer has a front side, and a backside having said copper contamination; said semiconductor wafer being oriented backside up on a wafer chuck.

37. The method of claim 29, wherein said semiconductor wafer has a front side having said copper contamination, and a backside; said semiconductor wafer being oriented backside up on a wafer chuck; and said oxidizing radical containing downstream plasma having a flow rate of from about 50 to 500 sccm and at a temperature from about 15 to 100 C.

38. The method of claim 29, wherein said semiconductor wafer has a front side having said copper contamination, and a backside having said copper contamination; said semiconductor wafer being oriented backside up on a wafer chuck; and said oxidizing radical containing downstream plasma having a flow rate of from about 50 to 500 sccm and at a temperature from about 15 to 100 C.

39. The method of claim 29, wherein said semiconductor wafer is placed within a reaction chamber having a pressure from about 0.01 to 100 Torr, said semiconductor wafer having a temperature from about 50 to 300° C.

40. The method of claim 29, wherein said halogen oxidizing agent is formed from halogens selected from the group comprising $F_2$, $Cl_2$, and $Br_2$.

* * * * *